United States Patent [19]

Blumenshine et al.

[11] Patent Number: 4,922,326
[45] Date of Patent: May 1, 1990

[54] CERAMIC SEMICONDUCTOR PACKAGE HAVING CRACK ARRESTOR PATTERNS

[75] Inventors: Kent M. Blumenshine; Harris L. Marcus; Kathleen A. Long-Daugherty, all of Austin, Tex.

[73] Assignee: Motorola, Inc., Schaumburg, Ill.

[21] Appl. No.: 220,292

[22] Filed: Jul. 18, 1988

[51] Int. Cl.⁵ ............................................. H01L 23/14
[52] U.S. Cl. ........................................ 357/80; 174/255
[58] Field of Search .................... 357/80, 69; 174/68.5

[56] References Cited

U.S. PATENT DOCUMENTS 4,417,392  12/1983  Ibrahim et al. ...................... 357/80

Primary Examiner—James W. Davie
Attorney, Agent, or Firm—Harry Wolin

[57] ABSTRACT

A ceramic semiconductor package wherein metal crack arrestor patterns are formed in the corners of the package thereby increasing the strength of the package and acting as a barrier to microcracks. The metal crack arrestor patterns may be electrically and physically isolated from metal interconnect lines in the package and also may be formed using the same processing steps that are used to form the metal interconnect lines.

14 Claims, 2 Drawing Sheets

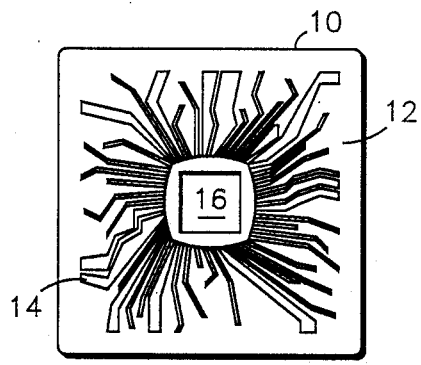
FIG. 1A
FIG. 1B
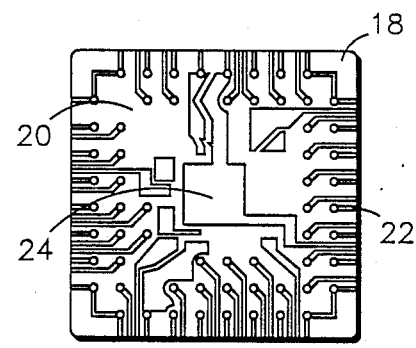
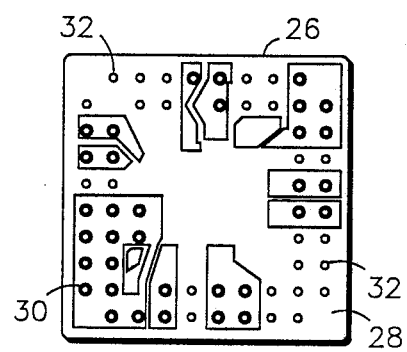
FIG. 1C

CERAMIC SEMICONDUCTOR PACKAGE HAVING CRACK ARRESTOR PATTERNS

BACKGROUND OF THE INVENTION

This invention relates, in general, to semiconductor packages, and more particularly to a ceramic semiconductor package having metal crack arrestor patterns strategically disposed therein.

It is well known in the semiconductor art that high quality semiconductor device packages may be manufactured from composite ceramic materials. Ceramics are especially useful in relatively large packages such as those used in pin grid arrays, leadless chip carriers, dual-in-line side brazed packages and the like. These ceramic packages may be comprised of a single layer of ceramic material or multiple layers of ceramic material that are bonded together. Generally, the ceramic layers are fabricated in a predetermined manner so that metal interconnect lines may be formed thereon. Tungsten alloys and other like metals are commonly used to form the interconnect lines. Ceramic semiconductor packages having multiple bonded ceramic layers as well as multiple layers of interconnect lines disposed thereon are well known in the art.

Generally, because ceramics are composite materials, the density of the material is not uniform throughout. Perosity and grain boundaries in the material allow for microcrack formation throughout the ceramic. The microcracks propagate within the ceramic and are not restricted until they encounter metal such as that used in interconnect lines and vias. Microcracking may occur in an exceptionally high number of composite ceramic semiconductor packages thereby causing relatively low yields and device lifetimes. Therefore, a composite ceramic semiconductor package that reduces or restricts microcracking throughout is highly desirable.

SUMMARY OF THE INVENTION

Accordingly, it is an object of the present invention to provide a ceramic semiconductor package that is inherently stronger than existing packages.

Another object of this invention is to provide a ceramic semiconductor package that is more resistant to microcrack initiation and propagation within the ceramic than existing packages.

It is an additional object of the present invention to provide a ceramic semiconductor package that will require less mechanical protection for transportation.

Yet another object of the present invention is to provide a ceramic semiconductor package which may be fabricated at high yields.

An even further object of the present invention is to provide a ceramic semiconductor package which will allow for longer device lifetime.

Finally, it is an object of the present invention to provide a ceramic semiconductor package having increased thermal conduction into the package because of increased internal metal.

The foregoing and other objects and advantages are achieved in the present invention by one embodiment in which, as a part thereof, a plurality of metal crack arrestor patterns are disposed on the surfaces of various layers of ceramic material. The plurality of metal crack arrestor patterns are formed simultaneously with the plurality of metal interconnect lines. Both the plurality of metal interconnect lines and the plurality of metal crack arrestor patterns are formed by screen printing methods well known in the art.

A more complete understanding of the present invention can be attained by considering the following detailed description in conjunction with the accompanying drawings.

BRIEF DESCRIPTION OF THE DRAWINGS

FIGS. 1A, 1B and 1C illustrate top views of various layers of a ceramic semiconductor package;

DETAILED DESCRIPTION OF THE INVENTION

Figure 2:
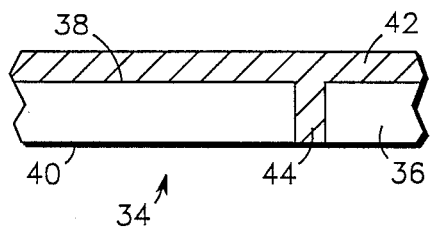
FIG. 2 illustrates a highly enlarged cross sectional view of a portion of a layer of a ceramic semiconductor package.

FIGS. 1A, 1B and 1C are top views of various layers of a ceramic semiconductor package. FIG. 1A shows a first layer of ceramic material 10 having a first surface 12. The ceramic material employed in the layers that comprise the semiconductor package may be one of the number of composite materials that are well known in the art. Disposed on first surface 12 of first layer ceramic material 10 are a plurality of metal interconnect lines 14. Metal interconnect lines 14 are processed on first layer of ceramic material 10 by screen printing metal on first surface 12. This method is well known in the art and this type of package commonly employs tungsten alloys for metal interconnect lines 14. First layer of ceramic material 10 further includes a die opening 16 through which a die may be wire bonded to pads disposed on first surface 12.

FIG. 1B shows a second layer of ceramic material 18 having a first surface 20. Second layer of ceramic material 18 is of the same type of material as first layer of ceramic material 10. A plurality of metal interconnect lines 22 are formed on first surface 20 of second layer ceramic material 18 by the method discussed above. Further, metal interconnect lines 22 include a die bond pad 24 on which a die will ultimately be bonded. It should be understood that die opening 16 (see FIG. 1A) will be aligned with die bond pad 24 when ceramic layers are bonded together.

FIG. 1C shows a third layer of ceramic material 26 having a first surface 28. Again, third layer of ceramic material 26 is of the same type of material employed in second layer of ceramic material 18 and first layer of ceramic material 10. First surface 28 includes metal interconnects 30 that are formed by methods discussed above. Third layer of ceramic material 26 also includes vias 32 which are employed to electrically connect the metal disposed on the various ceramic layers when vias 32 are filled with metal. Vias will be discussed presently.

Referring specifically to FIG. 2, a highly enlarged cross sectional view of a layer 34 of a ceramic semiconductor package is shown. Layer 34 includes a ceramic layer 36 having a first surface 38 and a second surface 40. Disposed on first surface 38 of ceramic layer 36 is a metal layer 42 that comprises interconnect lines. A via 44 is shown to extend through ceramic layer 36 from metal layer 42. In this embodiment, via 44 is filled with metal. Via 44 allows for the interconnect lines of metal layer 42 to extend to interconnect lines disposed on other layers of the ceramic semiconductor package thereby selectively connecting the various layers of metal interconnect lines. It should be understood that a typical multilayer ceramic semiconductor package will include numerous vias 44. It should further be understood by one skilled in the art that not all ceramic semiconductor packages employ vias 44. The various ceramic layers may be electrically connected to each other by the use of metal patterns along the outside of the package.

Referring back to FIGS. 1A, 1B and 1C, first layer of ceramic material 10, second layer of ceramic 18 and third layer of ceramic material 26 are positioned in a predetermined relationship and bonded together by methods well known in the art to form a multilayer ceramic semiconductor package. In this embodiment, metal interconnect lines 14 may be electrically connected to metal interconnect lines 22 which in turn may be connect to metal interconnects 30 by vias such as that shown in FIG. 2. It should be understood that other layers may be included in the multilayer ceramic semiconductor package. Further, one skilled in the art will recognize that although a multilayer ceramic semiconductor package is shown and described herein, a ceramic semiconductor package comprised of a single layer of ceramic material having metal interconnect lines formed thereon may also be employed.

One skilled in the art will understood that a ceramic semiconductor package of this type will have external contacts. Metal pins (not shown) are commonly used. The metal pins are are electrically connected to the internal metal and attached to the package by methods well known in the art such as brazing.

Figure 3:
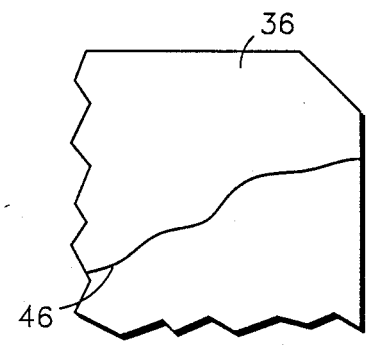
FIG. 3 is a highly enlarged top view of a corner of a layer of a ceramic semiconductor package.

Referring specifically to FIG. 3, a highly enlarged top view of a corner of a layer of a ceramic semiconductor package is shown. As mentioned previously, the ceramic layers of a semiconductor package such as ceramic layer 36 shown here, are comprised of a composite material. Therefore, ceramic layer 36 is not of uniform density throughout. As a result, microcracks 46 occur and propagate in the ceramic. This commonly occurs in the corners of a ceramic semiconductor package. Microcrack 46 will tend to propagate in the ceramic until it runs into metal which acts as a barrier for microcrack 46. Microcrack 46 decreases yield in ceramic semiconductor packages as well as decreasing lifetime of the device in which the package is used.

Figure 4A:
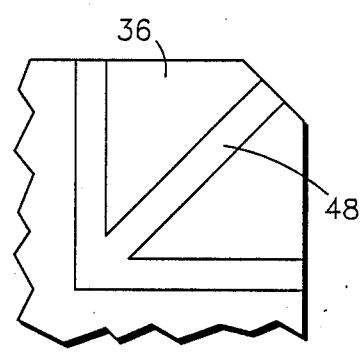
FIGS. 4A, 4B and 4C are highly enlarged top view of corners of layers of ceramic semiconductor packages having metal crack arrestor patterns disposed thereon.
Figure 4B:
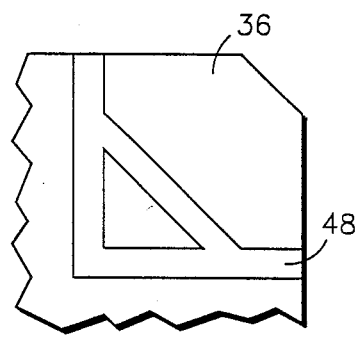
Figure 4C:
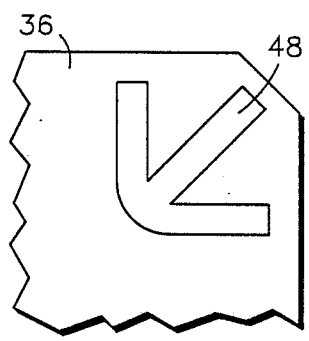

Referring specifically to FIGS. 4A, 4B and 4C, highly enlarged top views of corners of layers 36 of ceramic semiconductor packages having metal crack arrestor patterns 48 disposed thereon are shown. These figures illustrate various configurations of metal crack arrestor patterns 48. Since the propagation of microcrack 46 is inhibited by metal, it has been discovered that metal crack arrestor patterns 48 disposed in the corners of ceramic layer 36 will act as a barrier to microcracks 46. Essentially, metal crack arrestor patterns 48 will stop the progression of microcrack 46 before it reaches the actual metal circuitry disposed on ceramic layer 36. It should be understood that metal crack arrestor patterns 48 are not electrically or physically connected to the metal interconnect lines disposed on ceramic layer 36 in this embodiment, but it is possible that they may be.

Metal crack arrestor patterns 48 are formed using the same steps and same type metal (commonly tungsten alloys) used to form the metal interconnect lines. Therefore, no extra processing steps are necessary to form metal crack arrestor patterns 48. One skilled in the art will understand that although metal crack arrestor patterns 48 are only shown on one surface of ceramic layer 36 in this embodiment, metal crack arrestor patterns 48 may be formed on both surfaces. Further, it should be understood that metal crack arrestor patterns 48 may be formed on one or more of the ceramic layers of a multilayer ceramic semiconductor package. It will also be understood that the metal crack arrestor can have configurations other than those illustrated. As an example, it can be one wide piece instead of a line configuration.

In addition to acting as a barrier against microcracks 46, metal crack arrestor patterns 48 improve thermal conduction throughout the ceramic semiconductor package because the additional metal allows for improved heat transfer in the package thereby reducing the severity of thermal shock to the package. Also, because the corners of these packages are made stronger by metal crack arrestor patterns 48, the package is less prone to chipping and requires less mechanical protection for transportation.

Thus it is apparent that there has been provided, in accordance with the present invention, a ceramic semiconductor package which meets the objects and advantages set forth above. While specific embodiments of this invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

We claim:

1. A ceramic semiconductor package comprising:
  a layer of ceramic material, said layer of ceramic material having a first surface and a second surface;
  a plurality of metal interconnect lines disposed on said first surface of said layer of ceramic material; and
  a plurality of metal crack arrestor patterns disposed on said first surface of said layer of ceramic material, said plurality of metal crack arrestor patterns to serve as a barrier to cracks in said ceramic material.

2. The ceramic semiconductor package of claim 1 wherein the plurality of metal crack arrestor patterns are electrically isolated from the plurality of metal interconnect lines.

3. The ceramic semiconductor package of claim 2 wherein said package comprises a plurality of layers of ceramic material, each of said layers of ceramic material having a first surface and a second surface, said layers of ceramic material further being bonded together.

4. The ceramic semiconductor package of claim 3 wherein one or more layers of ceramic material include a plurality of metal interconnect lines disposed on the first surfaces thereof.

5. The ceramic semiconductor package of claim 4 wherein the metal interconnect lines disposed on the first surfaces of the various layers of ceramic material are electrically connected to each other by vias in said layers of ceramic material.

6. The ceramic semiconductor package of claim 5 wherein more than one layer of ceramic material include a plurality of metal crack arrestor patterns disposed on the first surfaces thereof.

7. The ceramic semiconductor package of claim 6 wherein one or more layers of ceramic material include a plurality of metal crack arrestor patterns disposed on the second surfaces thereof.

8. The ceramic semiconductor package of claim 7 wherein the metal interconnect lines and the metal crack arrestor patterns are comprised of a tungsten alloy.

9. A ceramic semiconductor package comprising:
   a plurality of layers of ceramic material, each layer having a first surface and a second surface, said layers of ceramic material being bonded together;
   a plurality of metal interconnect lines disposed on said first surfaces of one or more of said layers of ceramic material, said metal interconnect lines disposed on said various layers of ceramic material being electrically connected to said other metal interconnect lines disposed on said various other layers of ceramic material by vias disposed in said layers of ceramic material; and
   a plurality of metal crack arrestor patterns disposed on said first surfaces of one or more of said layers of ceramic material.

10. The ceramic semiconductor package of claim 9 wherein the plurality of metal crack arrestor patterns are electrically isolated from the plurality of metal interconnect lines.

11. The ceramic semiconductor package of claim 10 wherein one or more layers of ceramic material include a plurality of metal crack arrestor patterns disposed on the second surfaces thereof.

12. The ceramic semiconductor package of claim 11 wherein the metal interconnect lines and metal crack arrestor patterns are comprised of a tungsten alloy.

13. A ceramic semiconductor package comprising:
   a layer of ceramic material having a first surface;
   a formation of metal formed in the corners of said layer of ceramic material, said formation of metal being on said first surface of said layer of ceramic material to serve as a crack arrestor by being a barrier to cracking of said layer of ceramic material.

14. The ceramic semiconductor package of claim 13 wherein the formation of metal comprises crack arrestor lines.

* * * * *